United States Patent
Wu

(10) Patent No.: US 7,764,507 B2
(45) Date of Patent: Jul. 27, 2010

(54) PORTABLE ELECTRONIC DEVICE AND METHOD FOR ASSEMBLING THE SAME

(75) Inventor: Chun-Hua Wu, Tu-Cheng (TW)

(73) Assignee: Chi Mei Communication Systems, Inc., Tu-Cheng, Taipei County (TW)

( * ) Notice: Subject to any disclaimer, the term of this patent is extended or adjusted under 35 U.S.C. 154(b) by 267 days.

(21) Appl. No.: 12/039,044

(22) Filed: Feb. 28, 2008

(65) Prior Publication Data

US 2009/0168373 A1    Jul. 2, 2009

(30) Foreign Application Priority Data

Dec. 29, 2007    (CN) .................... 2007 1 0203562

(51) Int. Cl.
*H05K 7/02* (2006.01)
(52) U.S. Cl. .................... 361/749; 361/760; 174/254; 29/830
(58) Field of Classification Search ............... 361/749, 361/760; 174/254
See application file for complete search history.

(56) References Cited

U.S. PATENT DOCUMENTS

| | | | | |
|---|---|---|---|---|
| 5,513,996 | A | * | 5/1996 | Annerino et al. ............... 439/95 |
| 5,889,474 | A | * | 3/1999 | LaDue .................... 340/825.49 |
| 6,539,208 | B1 | * | 3/2003 | Mori ........................ 455/575.3 |
| 7,058,365 | B2 | * | 6/2006 | Kugler ........................ 455/90.3 |
| 7,551,417 | B2 | * | 6/2009 | Miyata ....................... 361/91.5 |
| 7,555,321 | B2 | * | 6/2009 | Yamada et al. ........... 455/575.1 |
| 2003/0013418 | A1 | * | 1/2003 | Kato ........................... 455/90 |
| 2004/0198455 | A1 | * | 10/2004 | Deeds ........................ 455/566 |
| 2005/0020327 | A1 | * | 1/2005 | Chung et al. ............. 455/575.3 |
| 2005/0105748 | A1 | * | 5/2005 | Bartell ........................ 381/306 |

* cited by examiner

*Primary Examiner*—Dameon E Levi
(74) *Attorney, Agent, or Firm*—Andrew C. Cheng

(57) ABSTRACT

A portable electronic device (100) includes a circuit board (102) and a subassembly (10) electronically connected to the circuit board. The subassembly includes a flexible printed circuit (FPC) (13), a speaker (11), and a vibrator (12). The FPC is electronically connected to the circuit board. Both the speaker and the vibrator are fixed to the FPC and electronically connected to the FPC to form the subassembly.

7 Claims, 3 Drawing Sheets

PORTABLE ELECTRONIC DEVICE AND METHOD FOR ASSEMBLING THE SAME

BACKGROUND OF THE INVENTION

1. Field of the Invention

The present invention generally relates to portable electronic devices and methods for assembling the same, particularly to a portable electronic device including a speaker and a vibrator and a method for assembling the same.

2. Description of Related Art

Speakers and vibrators are widely used in many kinds of portable electronic devices, such as mobile phones or game consoles. Compared with many other electronic components of portable electronic devices, speakers and vibrators are usually bigger in volume and more complicated in structure. Therefore, when a portable electronic device is fabricated, it is difficult to integrate a speaker and a vibrator into a circuit board of the portable electronic device. Generally, the speaker and the vibrator need to be independently manufactured, and then are assembled with the circuit board of the portable electronic device.

Typical methods for assembling the speaker and the vibrator with the circuit board are fixing the speaker and the vibrator to the circuit board via soldering or gluing, etc. However, when the speaker and the vibrator are assembled with the circuit board via soldering or gluing, excessive solder or glue may be applied to many portions of the circuit board. The excessive solder or glue needs to be carefully removed from the circuit board to avoid damage to the circuit board, thus a great deal of time is used in the cleaning operation.

Therefore, a portable electronic device and a method for assembling the same are desired in order to overcome the above-described shortcomings.

SUMMARY OF THE INVENTION

A portable electronic device includes a circuit board and a subassembly electronically connected to the circuit board. The subassembly includes a flexible printed circuit (FPC), a speaker and a vibrator. The FPC is electronically connected to the circuit board. Both the speaker and the vibrator are fixed to the FPC and electronically connected to the FPC to form the subassembly.

A method for assembling a portable electronic device comprising the steps of: providing a speaker, a vibrator and a FPC; forming a subassembly comprising the speaker, the vibrator and the FPC; providing a housing and a circuit board; and electronically connecting the FPC to the circuit board, and receiving the subassembly and the circuit board in the housing.

Other novel features will become more apparent from the following detailed description when taken in conjunction with the accompanying drawings.

BRIEF DESCRIPTION OF THE DRAWINGS

Many aspects of the portable electronic device and the method for assembling the same can be better understood with reference to the following drawings. The components in the drawings are not necessarily drawn to scale, the emphasis instead being placed upon clearly illustrating the principles of the portable electronic device and the method for assembling the same. Moreover, in the drawings, like reference numerals designate corresponding parts throughout the several views.

DETAILED DESCRIPTION OF THE INVENTION

Figure 1:
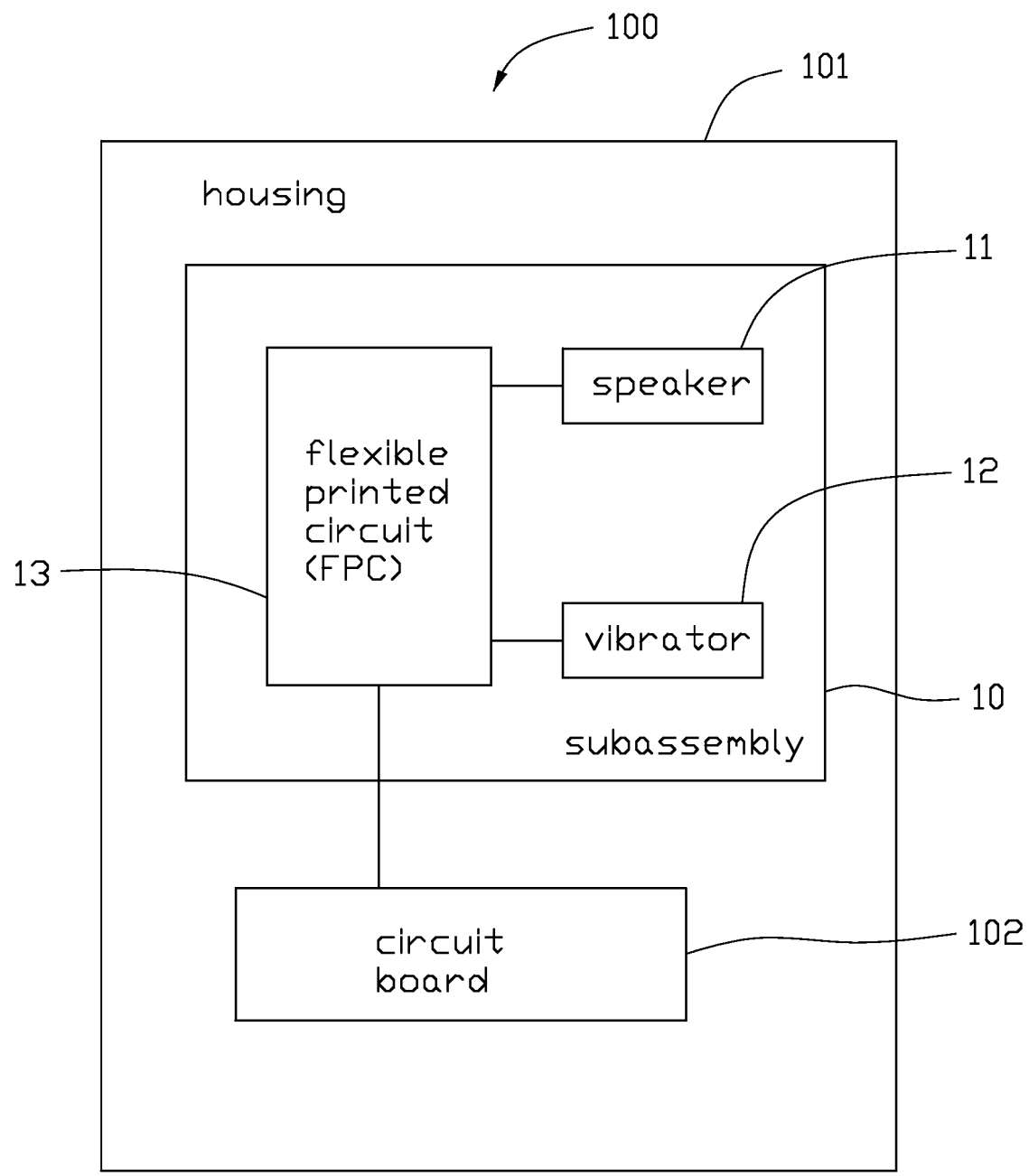
FIG. 1 is a diagram of a portable electronic device, in accordance with a present embodiment.

Referring to FIG. 1, a portable electronic device 100 in accordance with a present embodiment is provided. The portable electronic device 100 can be a mobile phone, a personal digital assistant (PDA), or a game console, etc. The portable electronic device 100 includes a housing 101 and a circuit board 102 received in the housing 101.

Figure 2:
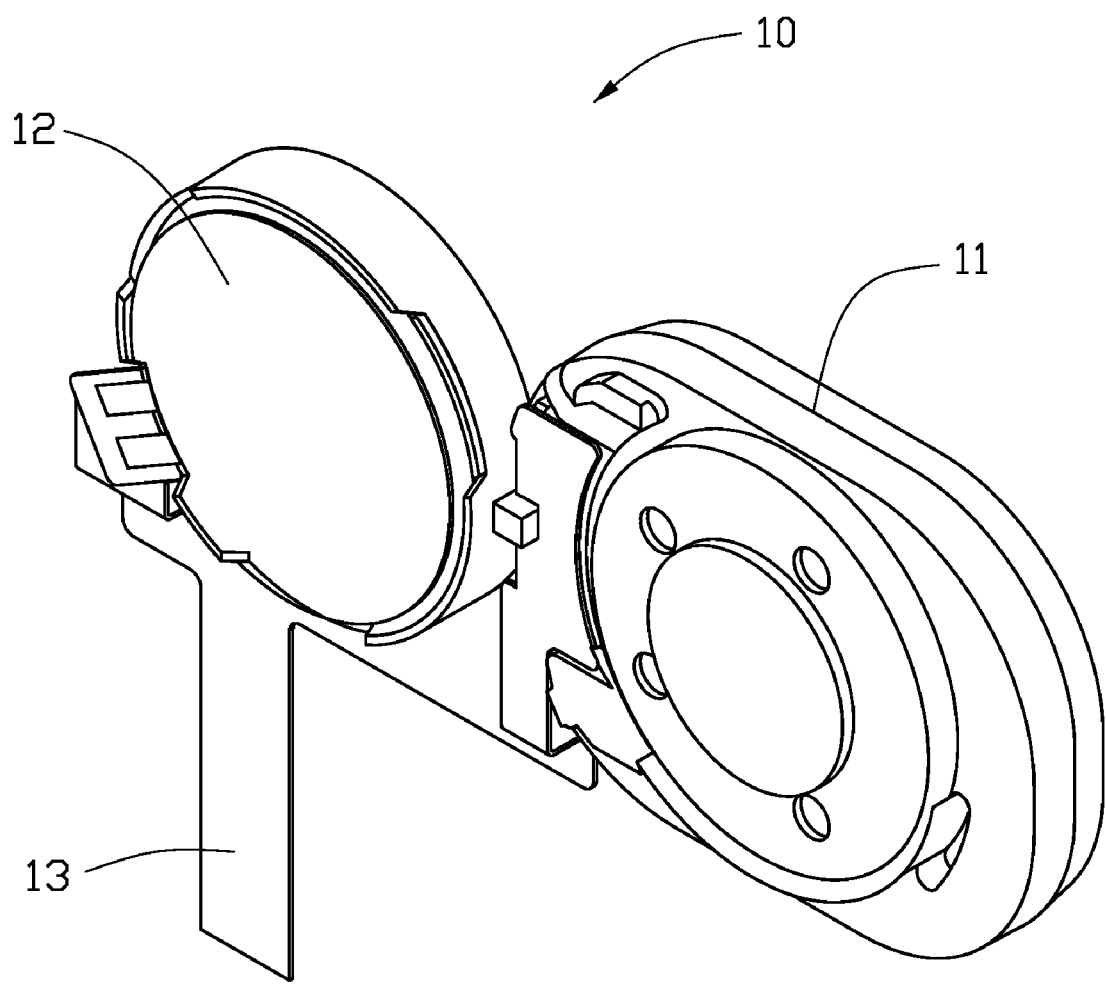
FIG. 2 is a schematic view of a subassembly of the portable electronic device shown in FIG. 1.

Also referring to FIG. 2, the portable electronic device 100 also includes a subassembly 10 which includes a speaker 11, a vibrator (for example, an electromotor) 12 and a flexible print circuit (FPC) 13. Both the speaker 11 and the vibrator 12 are fixed to the FPC 13, thus the speaker 11, the vibrator 12 and the FPC 13 form the subassembly 10. The method for fixing the speaker 11 and the vibrator 12 to the FPC 13 can be selected from a group consisting of soldering, gluing, bolting, rabbeting, etc. Both the speaker 11 and the vibrator 12 are electronically connected to the FPC 13, and the FPC 13 is electronically connected to the circuit board 102.

Figure 3:
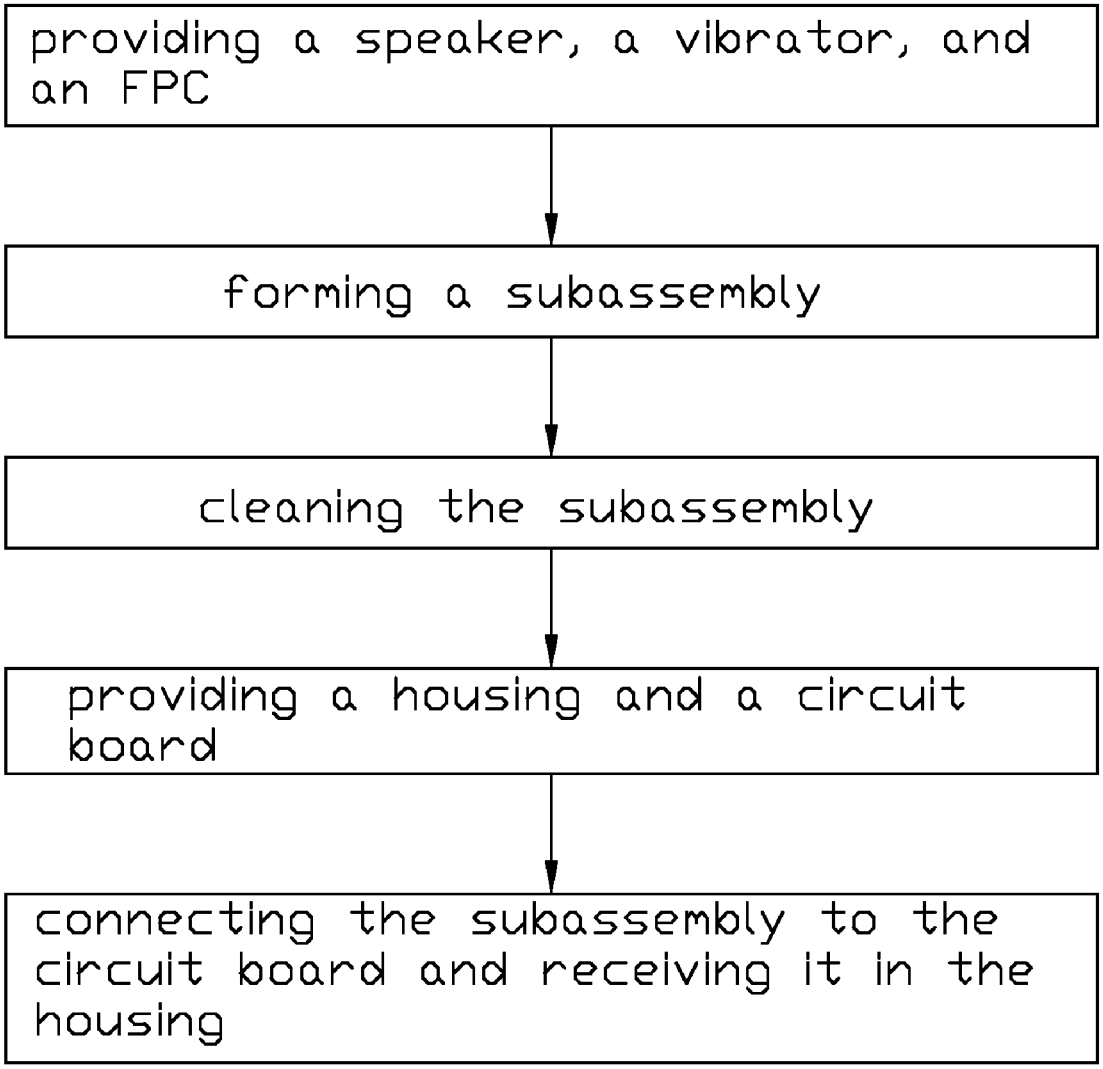
FIG. 3 is a flow chart of a method for assembling a portable electronic device, in accordance with a present embodiment.

Referring to FIG. 3, a method in accordance with a present embodiment that is configured for assembling the aforementioned portable electronic device 100 is provided. The method comprises the following steps.

First, providing a speaker 11, a vibrator 12, and a FPC 13.

Second, fixing the speaker 11 and the vibrator 12 to the FPC 13, and electronically connecting the speaker 11 and the vibrator 12 to the FPC 13, thereby forming a subassembly 10. The method for fixing the speaker 11 and the vibrator 12 to the FPC 13 can be selected from a group consisting of soldering, gluing, bolting, rabbeting, etc.

Third, cleaning the subassembly 10 to remove contamination that may remain on the subassembly 10, such as excessive solder or glue.

Fourth, providing a housing 101 and a circuit board 102.

Fifth, electronically connecting the FPC 13 to the circuit board 102, and receiving the cleaned subassembly 10 and the circuit board 102 in the housing 101. In this way, the portable electronic device 100 is assembled.

In the present portable electronic device 100, the speaker 11 is integrated with the vibrator 12 via the FPC 13, thus forming the subassembly 10. Compared with the speaker 11 and the vibrator 12 being separately attached to the circuit board 102, the integrated subassembly 10 occupies less volume and is more easily assembled with the circuit board 102.

In the present method, the speaker 11 is integrated with the vibrator 12 via the FPC 13 to form the subassembly 10, and the subassembly 10 is received in the housing 101 after being cleaned. Compared with the speaker 11 and the vibrator 12 being separately attached to the circuit board 102, the integrated subassembly 10 is more easily assembled with the circuit board 102. Furthermore, since the subassembly 10 has been cleaned before being received in the housing 101 and connected to the circuit board 102, the risky practice of cleaning contaminants, such as solder or glue, from the circuit board 102 is avoided. Additionally, it is obvious that cleaning the subassembly 10 before being connected to the circuit board 102 requires less time than the typical method, i.e., cleaning the circuit board 102 after the speaker 11 and the vibrator 12 being fixed thereon.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A portable electronic device, comprising:
   a circuit board; and
   a subassembly electronically connected to the circuit board, the subassembly consisting of a flexible printed circuit (FPC) electronically connected to the circuit board, a speaker, and a vibrator, both the speaker and the vibrator being fixed to the FPC and electronically connected to the FPC.

2. The portable electronic device as claimed in claim 1, further comprising a housing configured for receiving the circuit board and the subassembly therein.

3. The portable electronic device as claimed in claim 1, wherein the speaker and the vibrator are fixed to the FPC by at least one of the means in a group consisting of soldering, gluing, bolting, and rabbeting.

4. A method for assembling a portable electronic device, comprising the steps of:
   providing a speaker, a vibrator, and a flexible printed circuit (FPC);
   forming a subassembly consisting of the speaker, the vibrator and the FPC;
   providing a housing and a circuit board; and
   electronically connecting the FPC to the circuit board, and receiving the subassembly and the circuit board in the housing.

5. The method as claimed in claim 4, further comprising a step of cleaning the subassembly after the step of forming a subassembly consisting of the speaker, the vibrator, and the FPC.

6. The method as claimed in claim 4, wherein the step of forming a subassembly consisting of the speaker, the vibrator, and the FPC includes these substeps:
   fixing the speaker and the vibrator to the FPC; and
   electronically connecting the speaker and the vibrator to the FPC.

7. The method as claimed in claim 6, wherein the speaker and the vibrator are fixed to the FPC by at least one of the means in a group consisting of soldering, gluing, bolting, and rabbeting.

* * * * *